United States Patent
Yu et al.

(10) Patent No.: US 10,083,874 B1
(45) Date of Patent: Sep. 25, 2018

(54) GATE CUT METHOD

(71) Applicant: GLOBALFOUNDRIES INC., Grand Cayman (KY)

(72) Inventors: Hong Yu, Rexford, NY (US); Zhenyu Hu, Clifton Park, NY (US); Haiting Wang, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/467,536

(22) Filed: Mar. 23, 2017

(51) Int. Cl.
| | |
|---|---|
| *H01L 21/311* | (2006.01) |
| *H01L 21/302* | (2006.01) |
| *H01L 21/461* | (2006.01) |
| *B44C 1/22* | (2006.01) |
| *C03C 15/00* | (2006.01) |
| *C03C 25/68* | (2006.01) |
| *C23F 1/00* | (2006.01) |
| *H01L 21/8234* | (2006.01) |
| *H01L 21/033* | (2006.01) |
| *H01L 29/66* | (2006.01) |
| *H01L 21/28* | (2006.01) |
| *H01L 21/3213* | (2006.01) |
| *H01L 21/8238* | (2006.01) |
| *H01L 21/3065* | (2006.01) |

(52) U.S. Cl.
CPC .. *H01L 21/823437* (2013.01); *H01L 21/0332* (2013.01); *H01L 21/0337* (2013.01); *H01L 21/28123* (2013.01); *H01L 21/3065* (2013.01); *H01L 21/31116* (2013.01); *H01L 21/32139* (2013.01); *H01L 21/82385* (2013.01); *H01L 21/823431* (2013.01); *H01L 21/823462* (2013.01); *H01L 21/823828* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 2017/0084723 A1* | 3/2017 | Greene | H01L 29/0649 |
| 2017/0358672 A1* | 12/2017 | Anderson | H01L 29/785 |

* cited by examiner

*Primary Examiner* — Stephanie P Duclair
(74) *Attorney, Agent, or Firm* — Scully Scott Murphy and Presser; Frank DiGiglio

(57) ABSTRACT

A method of manufacturing a FinFET structure involves forming gate cuts within a sacrificial gate layer prior to patterning and etching the sacrificial gate layer to form longitudinal sacrificial gate structures. By forming transverse cuts in the sacrificial gate layer before defining the sacrificial gate structures longitudinally, dimensional precision of the gate cuts at lower critical dimensions can be improved.

18 Claims, 12 Drawing Sheets

GATE CUT METHOD

BACKGROUND

The present application relates generally to semiconductor devices, and more specifically to methods for manufacturing fin field effect transistors.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

The gate structure may be formed using a gate-first or a gate-last fabrication process. A gate-last process, such as a replacement metal gate (RMG) process, utilizes a sacrificial or dummy gate, which is replaced by a functional gate after device activation, i.e., after dopant implantation into source/drain regions of the fins and an associated drive-in anneal, in order to avoid exposing the functional gate materials to the thermal budget associated with activation.

A self-aligned contact (SAC) process may then be used to form conductive contacts to the source/drain regions as well as to the FET gate. In advanced nodes, the SAC process may benefit from a taller gate structure, which may simplify certain aspects of the associated etching, including enabling precise placement of vias or trenches having a small critical dimension (CD). Critical dimension uniformity, however, and especially the formation of non-tapered (i.e., vertical) etch features through a taller dummy gate structure remains a challenge.

SUMMARY

Accordingly, it would be beneficial to provide a method for defining a sacrificial gate structure at critical dimensions with a high degree of accuracy and precision, especially such a gate structure with a substantially vertical profile.

Disclosed is a gate cut scheme that may be used in conjunction with a replacement metal gate (RMG) process flow for manufacturing fin field effect transistors (FinFETs) where the gate cut is performed prior to patterning the sacrificial gate.

In accordance with embodiments of the present application, the method includes forming a sacrificial gate layer over a plurality of semiconductor fins, and etching the sacrificial gate layer in a first etching step to form a gate cut opening that extends through the sacrificial gate layer, such that the gate cut opening is located between an adjacent pair of the fins. Following the first etching step, a second etching step is used to etch the sacrificial gate layer to form a first sacrificial gate structure that overlies a first one of the pair of adjacent fins and a second sacrificial gate structure that overlies a second one of the pair of adjacent fins.

In further embodiments, a method of forming a semiconductor structure includes forming a sacrificial gate layer over a plurality of semiconductor fins, and etching the sacrificial gate layer in a first etching step to form a gate cut opening located between an adjacent pair of the fins. The method further includes forming a spacer layer on sidewalls of the gate cut opening and depositing a fill layer within the gate cut opening to fill the gate cut opening. A patterned hard mask is formed over the sacrificial gate layer and, using the patterned hard mask as an etch mask, the sacrificial gate layer is etched to form a first sacrificial gate structure that overlies a first one of the pair of adjacent fins and a second sacrificial gate structure that overlies a second one of the pair of adjacent fins.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Figure 1:
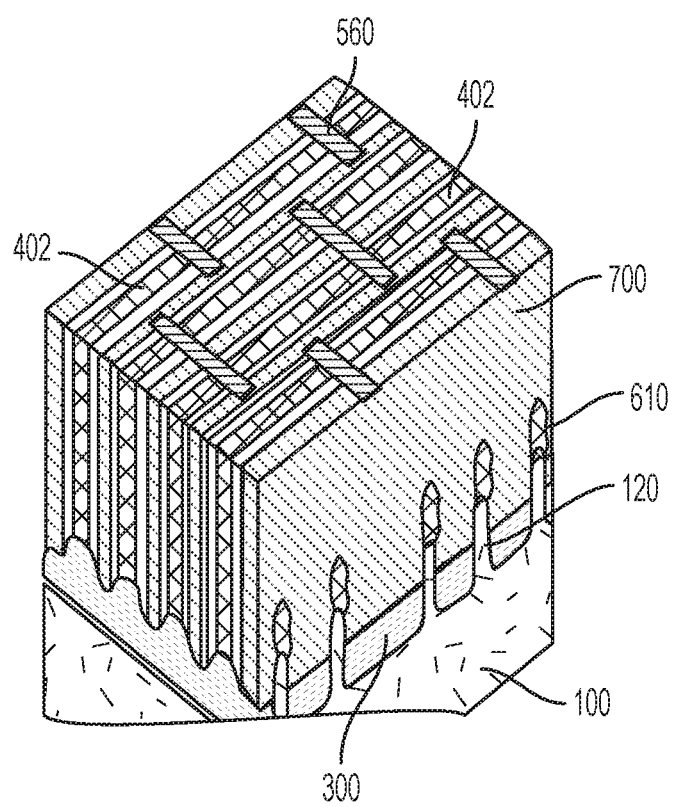
FIG. 1 is a perspective diagram of a FinFET device showing a plurality of sacrificial gates disposed over semiconductor fins following a gate cut module.

Reference will now be made in greater detail to various embodiments of the subject matter of the present application, some embodiments of which are illustrated in the accompanying drawings. The same reference numerals will be used throughout the drawings to refer to the same or similar parts.

A simplified perspective view of a FinFET structure is shown in FIG. 1. The exemplary structure includes a semiconductor substrate 100 and a plurality of semiconductor fins 120 arrayed over the substrate 100. The semiconductor fins 120 are arranged in parallel and are laterally isolated from each other by a shallow trench isolation layer 300, and raised source/drain junctions 610 are disposed over the fins 120 proximate to top surfaces thereof. One or more dielectric layers 700 are disposed over the fins, and plural sacrificial gate structures 402 straddle the fins. The sacrificial gate structures 402 have been segmented, or cut, to define discrete devices. The cut regions have been backfilled with a dielectric layer 560 along a longitudinal direction in order to isolate the sacrificial gate structures 402 associated with respective devices.

Further to the foregoing, disclosed are methods of manufacturing FinFET architectures, and more particularly methods where segmentation precedes the patterning and etching steps used to define the sacrificial gate structures. Segmentation includes providing a gate cut that is parallel to a length direction of the fins through a sacrificial gate layer. Various embodiments related to the formation of such FinFET structures are described herein with reference to FIGS. 2-12.

Figure 2A:
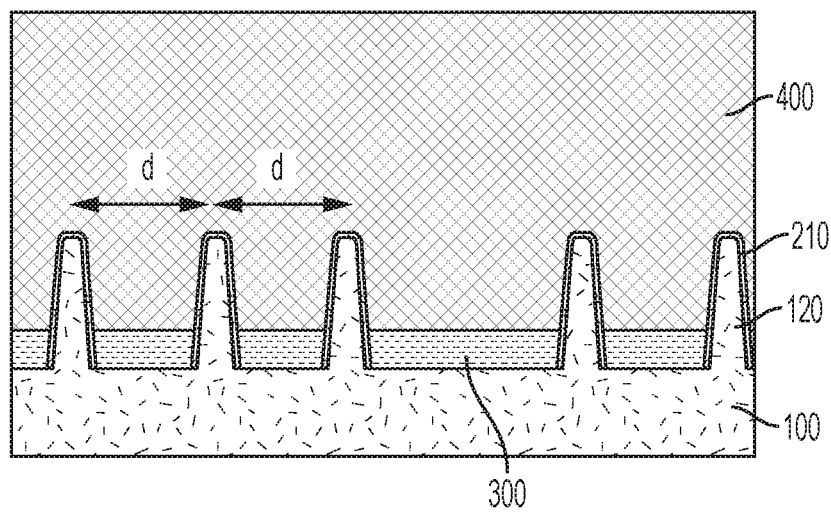
FIG. 2A is a cross-sectional schematic diagram of an exemplary structure after forming a sacrificial gate layer over a plurality of semiconductor fins disposed on a semiconductor substrate.

Referring to the structure depicted in the cross-sectional view of FIG. 2A, a plurality of fins 120 are arrayed over a semiconductor substrate 100. Substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may comprise other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that comprises, from bottom to top, a handle portion, an isolation layer, and a semiconductor material layer.

Substrate 100 may have dimensions as typically used in the art and may comprise, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may comprise (100)-oriented silicon or (111)-oriented silicon, for example.

In various embodiments, fins 120 comprise a semiconductor material such as silicon, and may be formed by patterning and then etching the semiconductor substrate 100, i.e., a top portion of the semiconductor substrate. In several embodiments, the fins 120 are etched from, and therefore contiguous with the semiconductor substrate 100. For instance, fins 120 may be formed using a sidewall image transfer (SIT) process as known to those skilled in the art.

In embodiments, the fins 120 can have a width of 5 nm to 20 nm, a height of 40 nm to 150 nm, and a pitch of 20 nm to 100 nm, although other dimensions are also contemplated. Fins 120 may be arrayed on the substrate at a regular intrafin spacing or pitch (d). As used herein, the term "pitch" refers to the distance between one structure or feature (e.g., a first fin) and an adjacent structure or feature (e.g., a second fin). In example embodiments, the fin pitch (d) may be within a range of 20 to 100 nm, e.g., 20, 30, 40, 50, 60, 70, 80, 90 or 100 nm, including ranges between any of the foregoing values, although smaller and larger pitch values may be used.

Portions of the fins 120 may be coated with a thin oxide layer, which is referred to herein as an extended gate or EG oxide layer 210. The EG oxide layer 210 may comprise silicon dioxide, for example. The EG oxide layer 210 may be a conformal coating having a thickness of 2 to 3 nm. During the course of manufacturing the FinFET structure, the EG oxide may be stripped from source and drain regions of the fins.

A shallow trench isolation (STI) layer 300 may be used to provide electrical isolation between the fins 120 and between adjacent devices as is needed for the circuit(s) being implemented. An STI process for FinFET devices involves creating isolation trenches in the semiconductor substrate 100 through an anisotropic etch process. The isolation trench between each adjacent fin may have a relatively high aspect ratio (e.g., ratio of the depth of the isolation trench to its width). A dielectric filler material, such as silicon oxide, is deposited into the isolation trenches, for example, using an enhanced high aspect ratio process (eHARP) to fill the isolation trenches. The deposited dielectric material may then be polished by a chemical-mechanical polishing (CMP) process that removes the excess dielectric material and creates a planar STI structure. As shown in FIG. 2A, the planarized oxide is etched back to form a recessed, uniformly thick oxide isolation layer 300 between the fins 120, where upper sidewalls of the fins 120 are exposed for further processing.

A sacrificial gate layer 400 is formed over the fins 120 and over the STI layer 300, i.e., over substrate 100. The sacrificial gate layer 400 may comprise a blanket layer of amorphous silicon (a-Si), for example. Amorphous elemental silicon can be deposited using chemical vapor deposition, such as low pressure chemical vapor deposition (LPCVD) at temperatures ranging from 450° C. to 700° C. Silane (SiH$_4$) can be used as the precursor for CVD silicon deposition. The sacrificial gate layer 400 may have a thickness sufficient to completely cover the fins. For instance, a thickness of sacrificial gate layer 400 may range from 50 to 200 nm, e.g., 50, 75, 100, 125, 150, 175 or 200 nm, including ranges between any of the foregoing values, although lesser and greater thicknesses may be used. A CMP process may be used to planarize a top surface of the sacrificial gate layer 400.

"Planarization" refers to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Optionally, a sacrificial oxide layer (not shown) may be deposited over the sacrificial gate layer 400 prior to a CMP step and then subsequently removed during the CMP step in order to enhance planarization. During the planarization step, the sacrificial gate layer 400 may serve as a CMP etch stop.

Figure 2B:
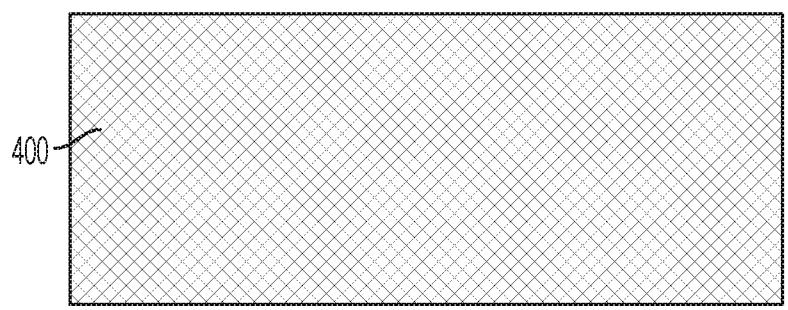
FIG. 2B is a top-down plan view of the structure of FIG. 2A showing a planar top surface of the sacrificial gate layer.

FIG. 2B is a top-down plan view of the structure of FIG. 2A showing a planar top surface of the sacrificial gate layer 400. In certain embodiments, a non-selective etch such as a reactive ion etch (RIE) of the post-planarized sacrificial gate layer 400 may be used to define the thickness of the sacrificial gate layer 400.

As will be described in further detail below, sacrificial gate layer 400 is adapted to be patterned and provide a sacrificial structure for a replacement metal gate (RMG) module for defining a gate structure over the fins.

Figure 3A:
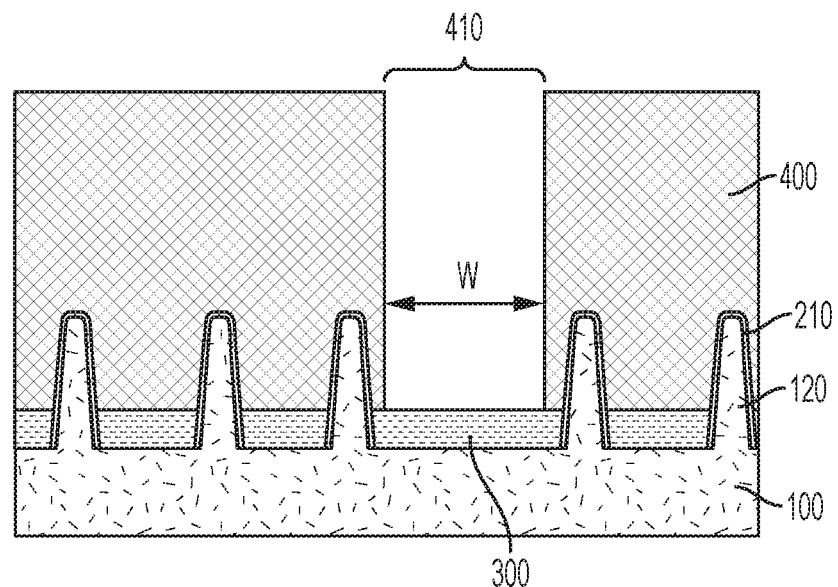
FIG. 3A depicts etching of the sacrificial gate layer to form a gate cut opening therein between a pair of adjacent fins.
Figure 3B:
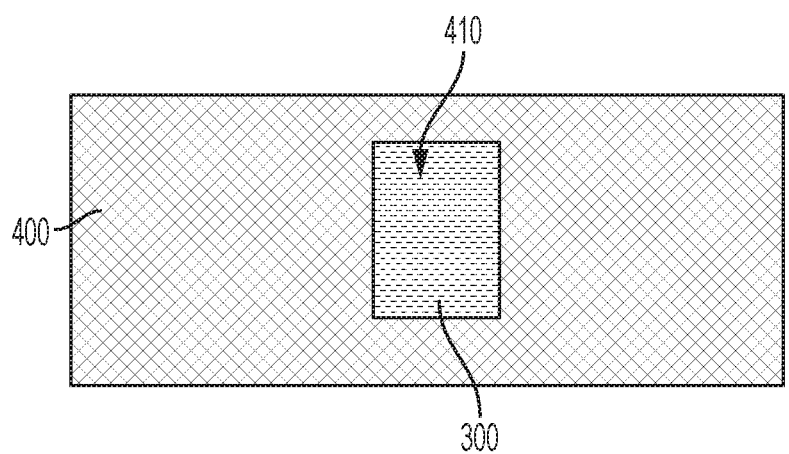
FIG. 3B is a top-down plan view of the structure of FIG. 3A showing the gate cut opening extending through the sacrificial gate layer to expose a shallow trench isolation layer between the adjacent fins.

Referring to FIG. 3A and FIG. 3B, a gate cut opening 410 may be formed by etching the sacrificial gate layer 400. As shown in the illustrated embodiment, the gate cut opening 410 extends through the sacrificial gate layer 400 and exposes STI region 300. A gate cut opening 410 is configured to expose a portion of the STI layer 300 between adjacent fins without exposing the fins themselves.

Gate cut opening 410 may be formed using patterning and etching processes known to those skilled in the art. The patterning process may comprise photolithography, for example, which includes forming a layer of photoresist material (not shown) atop one or more layers to be patterned. The photoresist material may include a positive-tone photoresist composition, a negative-tone photoresist composition, or a hybrid-tone photoresist composition. A layer of photoresist material may be formed by a deposition process such as, for example, spin-on coating.

The deposited photoresist is then subjected to a pattern of irradiation, and the exposed photoresist material is developed utilizing a conventional resist developer. The pattern provided by the patterned photoresist material is thereafter transferred into the sacrificial gate layer 400 utilizing at least one pattern transfer etching process.

The pattern transfer etching process is typically an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

A gate cut opening 410 may have areal dimensions (length and width) that independently range from 30 to 40 nm, although lesser and greater dimensions may be used. According to various embodiments, the relatively large areal dimensions (w) of the as-formed gate cut openings 410 are within lithography process windows for forming such structures, and enable the gate cut openings 410 to be defined with substantially vertical sidewalls. As used herein, "substantially vertical" sidewalls deviate from a direction normal to a major surface of the substrate by less than 5°, e.g., 0, 1, 2, 3, 4, or 5°, including ranges between any of the foregoing values.

Figure 4A:
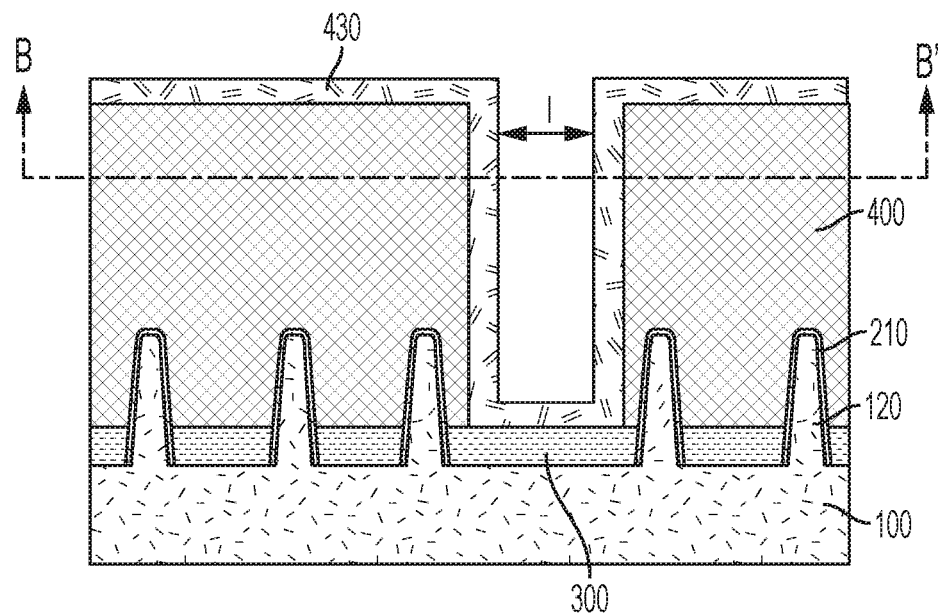
FIG. 4A shows the deposition of a conformal spacer layer over the sacrificial gate layer and within the gate cut opening.
Figure 4B:
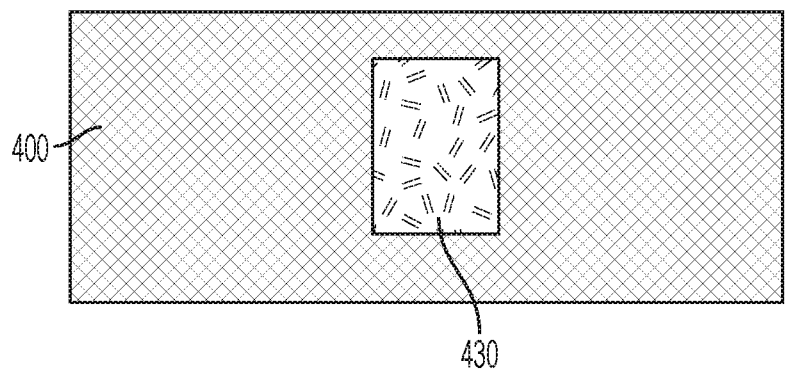
FIG. 4B is a top-down cut away view of the structure of FIG. 4A along the line B-B'.

Thereafter, referring to FIGS. 4A and 4B, a spacer layer 430 is formed over the sacrificial gate layer 400 and within gate cut openings 410. In various embodiments, formation of the spacer layer 430 includes a conformal deposition process such as a chemical vapor deposition (CVD) process. The thickness of the spacer layer 430 may range from 5 to 10 nm, for example. In various embodiments, the spacer layer 430 comprises amorphous silicon and may be formed using the processes and materials described above with respect to the sacrificial gate layer 400.

Figure 5A:
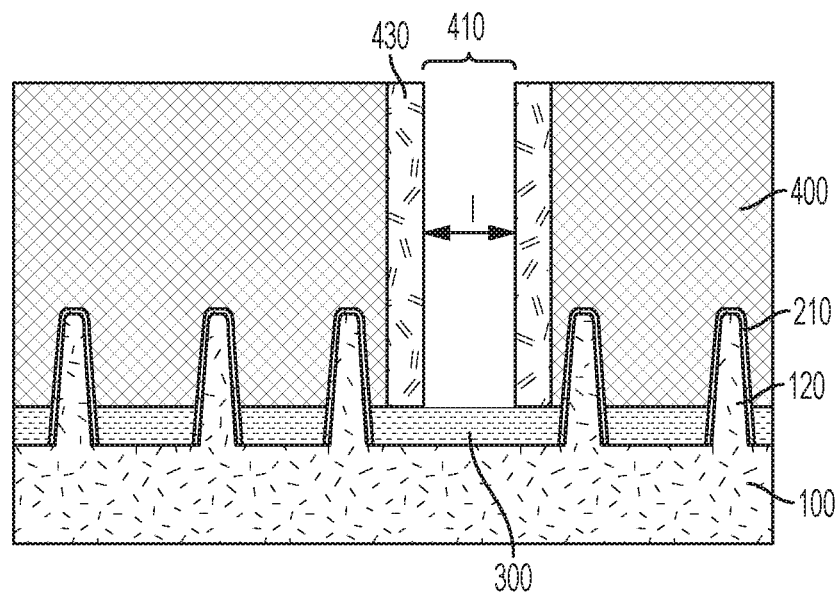
FIG. 5A shows the structure of FIG. 4A following an anisotropic etch of the conformal spacer layer.
Figure 5B:
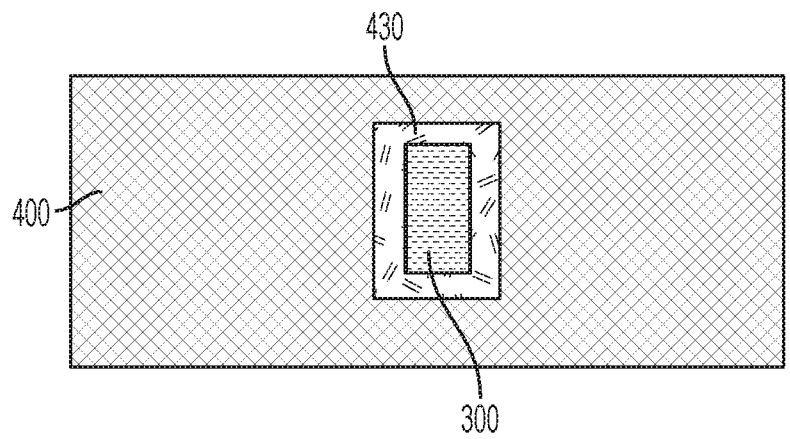
FIG. 5B is a top-down plan view showing the sidewall spacer layer inlaid within the gate cut opening and the attendant narrowing of the gate cut opening.

Formation of the spacer layer 430 is followed by an anisotropic etch, such as a reactive ion etch, to remove the spacer material(s) from horizontal surfaces, which exposes a top surface of the sacrificial gate layer 400 and a top surface of the STI layer 300 within the gate cut openings 410. As shown in FIGS. 5A and 5B, after the anisotropic etch, a thin structure of the spacer layer 430 remains on the sidewalls of each gate cut opening 410.

The spacer layer 430 remaining over the gate cut opening sidewalls can be used to tailor the areal dimensions (i.e., critical dimension(s)) of the gate cut openings. In other words, rather than directly patterning and etching a gate cut opening 410 having a desired critical dimension, in various embodiments an intermediate gate cut opening is formed having a larger critical dimension, which is decreased by forming the spacer layer 430 on sidewalls of the intermediate opening. The present approach allows the critical dimension of the gate cut opening 410 to be defined with precision. By way of example, the areal dimensions (length and width) of the gate cut openings that include the spacer layer 430 may independently range from 10 to 20 nm, e.g., 10, 15 or 20 nm, including ranges between any of the foregoing values. In certain embodiments, gate cut openings that include the spacer layer 430 have substantially vertical sidewalls.

Figure 6A:
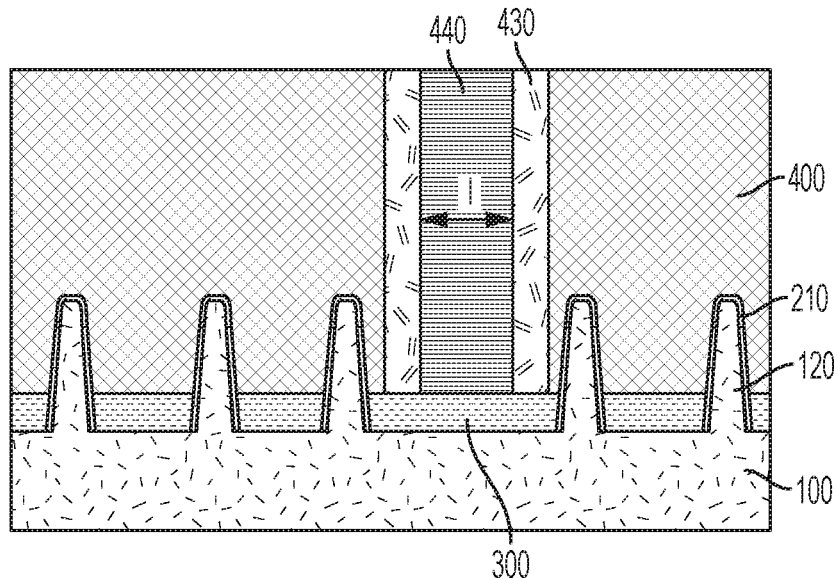
FIG. 6A is a post-planarization cross-sectional view following the deposition of a fill layer within the gate cut opening.
Figure 6B:
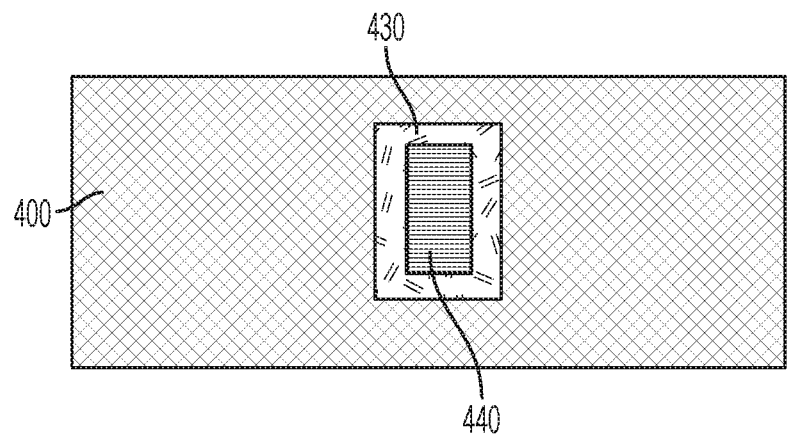
FIG. 6B is a top-down plan view showing the inlaid sidewall spacer and fill layer.

Referring to FIGS. 6A and 6B, a fill layer 440 may be deposited over the sacrificial gate layer 400 and within gate cut openings 410. In various embodiments, the fill layer completely fills the gate cut openings 410. For instance, the fill layer 440 may be formed by atomic layer deposition (ALD) and may comprise a nitride compound such as silicon nitride. During an exemplary ALD process, a silicon-containing precursor and a nitrogen-containing precursor are deposited in succession and reacted to form the nitride fill layer.

As shown in FIG. 6A, a chemical mechanical polishing step may be used to selectively remove the overburden and produce a planarized structure. The sacrificial gate layer 400 may serve as a CMP etch stop during removal of the excess fill layer material. FIG. 6B is a top-down plan view showing an inlaid fill layer 440 and sidewall spacers 430.

Figure 7A:
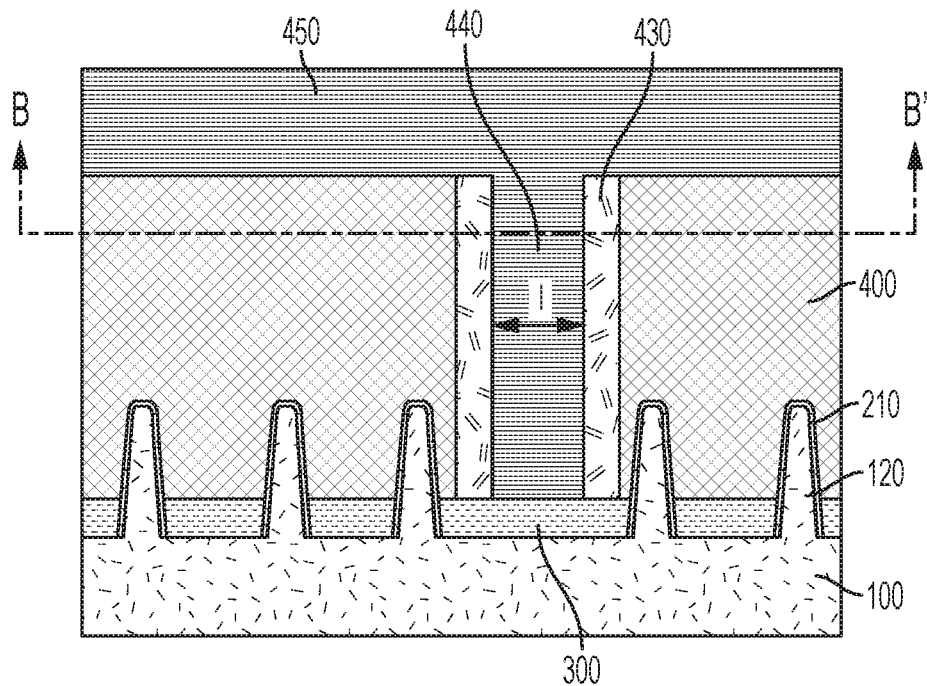
FIG. 7A shows the deposition of a hard mask layer over the structure of FIG. 6A.
Figure 7B:
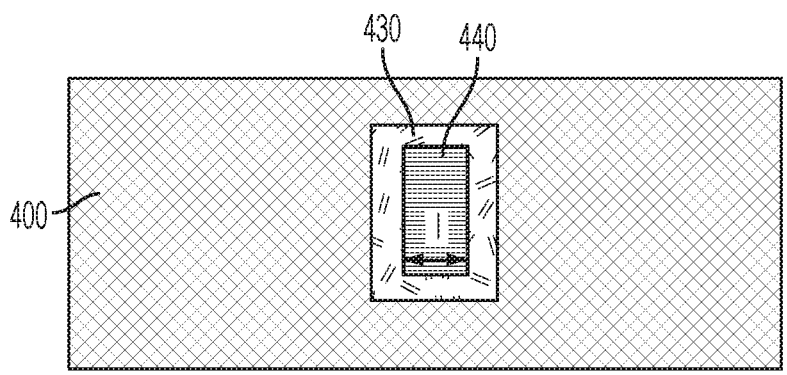
FIG. 7B is a top-down cut away view of the structure of FIG. 7A along the line B-B'.

FIGS. 7A and 7B show the deposition of a hard mask layer 450 over the structure of FIG. 6A, i.e., over top surfaces of the sacrificial gate layer 400, sidewall spacers 430, and fill layer 440. The hard mask layer 450, such as a silicon nitride hardmask layer, may be deposited by chemical vapor deposition. In certain embodiments, the hard mask layer 450 has a thickness of 50 to 100 nm. FIG. 7B is a top-down cut away view along the line B-B' of FIG. 7A showing the inlaid architecture within the gate cut opening.

After deposition of the hard mask layer 450, patterning and etching processes are used to form sacrificial gate structures with the sacrificial gate cut already incorporated into the architecture. That is, the previously-formed gate cut opening 410 defines the gate cut that segments the sacrificial gate structures once formed.

Figure 8A:
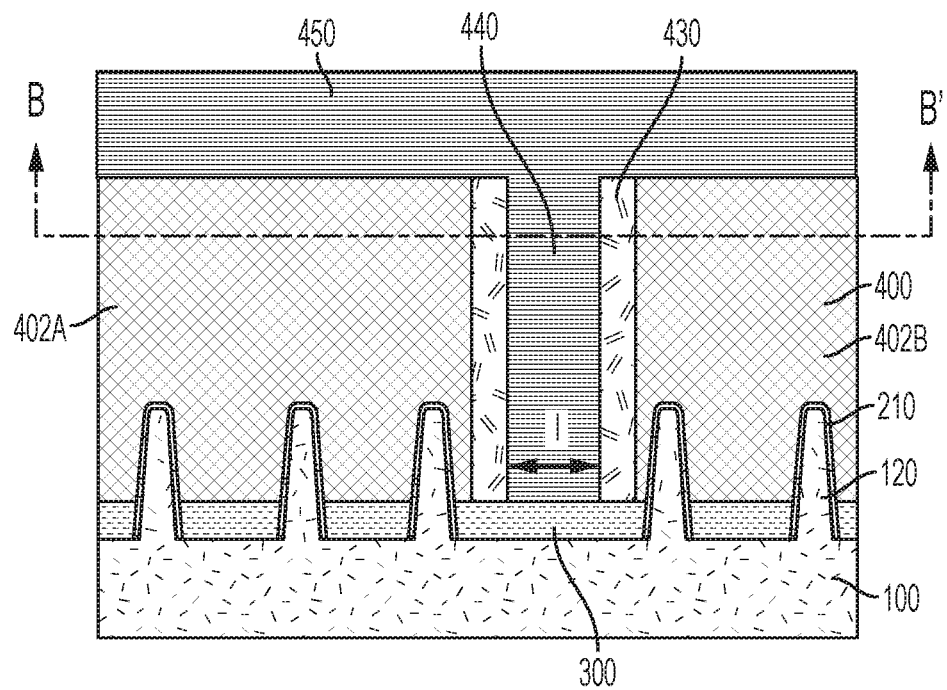
FIG. 8A is a cross-sectional view of adjacent sacrificial gate structures disposed over semiconductor fins.
Figure 8B:
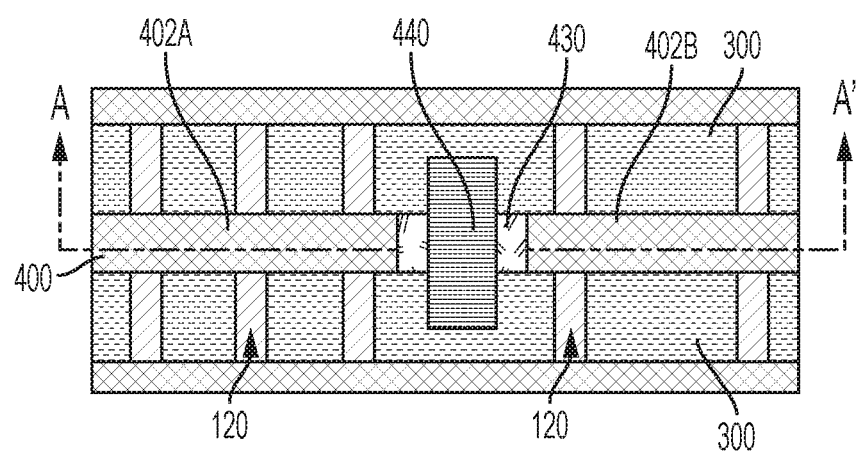
FIG. 8B shows etching of the sacrificial gate layer to form pre-cut sacrificial gate structures over the semiconductor fins.

Referring to FIG. 8A and FIG. 8B, the hard mask layer 450 may be patterned using conventional photolithography, followed by an etching step to transfer the pattern from the hard mask layer 450 into the sacrificial gate layer 400 to form sacrificial gate structures.

FIG. 8A is a cross-sectional view of adjacent sacrificial gate structures 402A, 402B, each disposed over plural fins 120. By way of example, sacrificial gate structure 402A may be disposed over a first plurality of fins, while sacrificial gate structure 402B may be disposed over a second plurality of fins different from the first plurality of fins. Depending on the design requirements for the associated device, the number of fins (N) underlying each of the sacrificial gate structures may independently vary from 2 to 100, although a greater number of fins may be used. Etching of the sacrificial gate layer 400 to expose portions of the fins 120 and define pre-cut sacrificial gate structures 402A, 402B over channel regions of the semiconductor fins 120 is shown in FIG. 8B. At the present stage of manufacture, longitudinally adjacent sacrificial gate structures 402A, 402B are separated by fill layer 440.

Figure 9A:
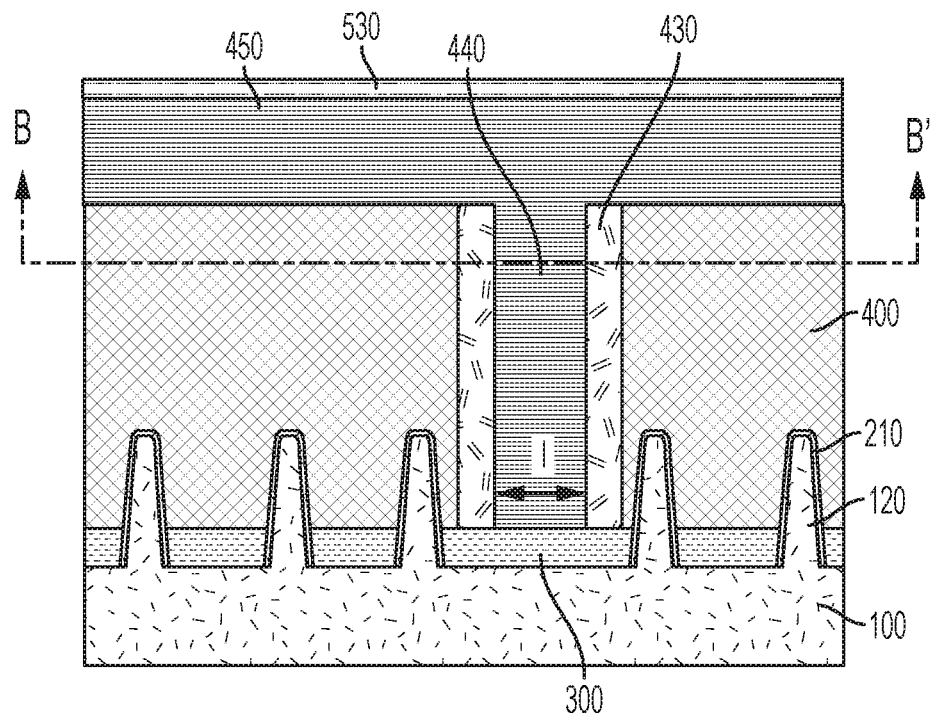
FIG. 9A depicts the formation of a sacrificial gate spacer over the hard mask layer.
Figure 9B:
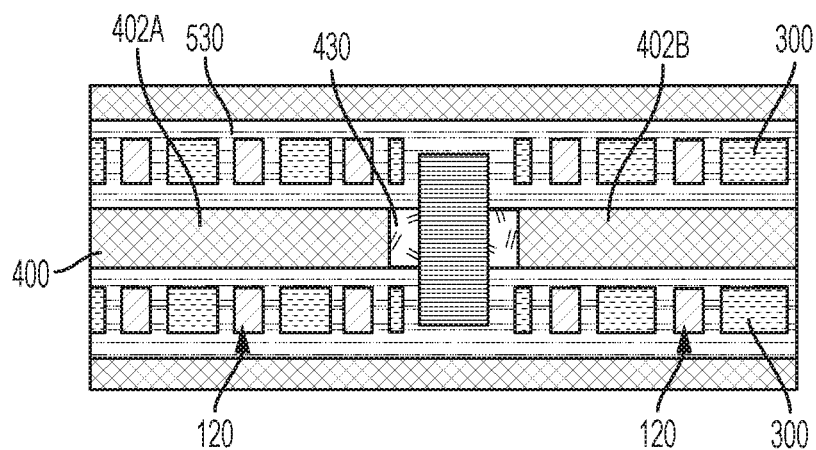
FIG. 9B shows formation of the sacrificial gate spacer of FIG. 9A over sidewalls of the sacrificial gate structures.

Referring to FIGS. 9A and 9B, in preparation for the formation of epitaxial source/drain junctions within source/drain regions of the fins, a sacrificial gate spacer layer 530 is formed over exposed surfaces of the structure using a conformal deposition process such as chemical vapor deposition (CVD) or atomic layer deposition (ALD), followed by an anisotropic etch. The thickness of the sacrificial gate spacer layer 530 may range from 5 to 15 nm, for example, although lesser and greater thicknesses are contemplated. In various embodiments, the sacrificial gate spacer layer 530 comprises silicon nitride or a low-k material such as silicon oxycarbide (SiOC).

As seen in FIG. 9B, following the anisotropic etch, remaining portions of the sacrificial gate spacer layer 530 are disposed over sidewalls of the sacrificial gate structures 402A, 402B, as well as over sidewalls of the source/drain regions of the fins 120, i.e., over fin sidewalls between laterally adjacent sacrificial gate structures.

A patterned etching step may then be used to remove the sacrificial gate spacer layer 530 and EG oxide from source/drain regions of the fins 120, while the sacrificial gate spacer layer 530 is retained on sidewalls of the sacrificial gate structures 402A, 402B.

Figure 10A:
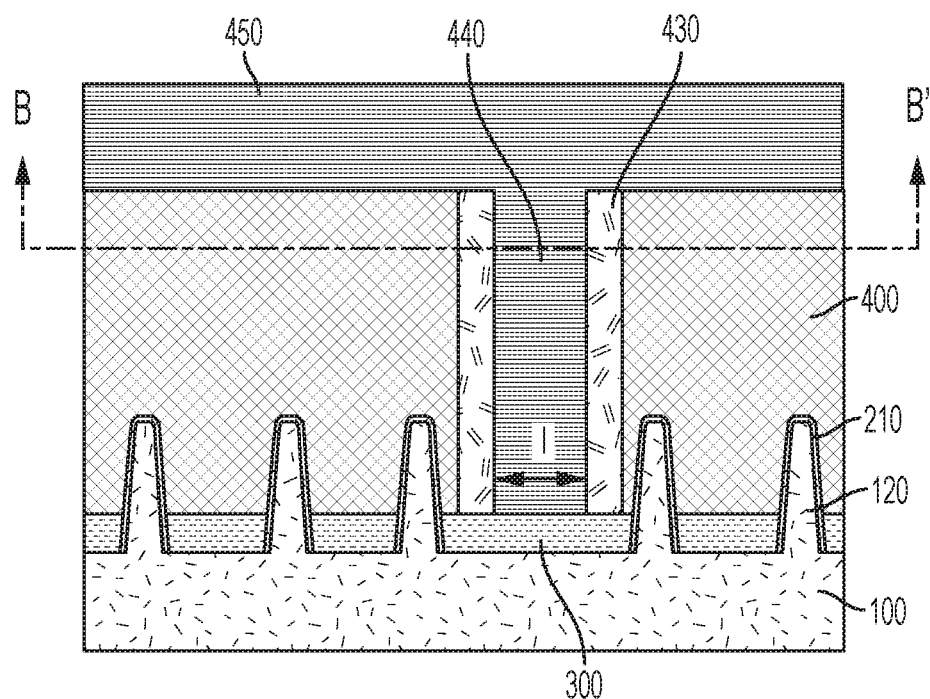
FIG. 10A shows the structure of FIG. 9A following an anisotropic etch of the sacrificial gate spacer and the formation of epitaxial source/drain junctions over source/drain regions of the fins.
Figure 10B:
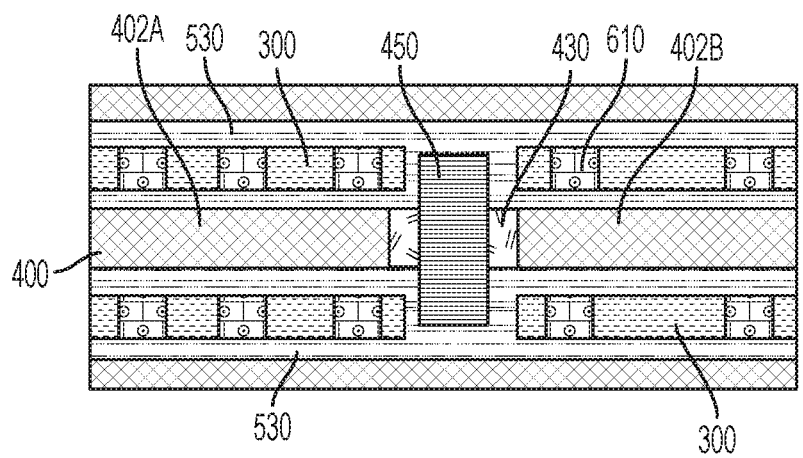
FIG. 10B shows the structure of FIG. 9B following an anisotropic etch of the sacrificial gate spacer and the formation of epitaxial source/drain junctions over source/drain regions of the fins.

The subsequent formation by epitaxial growth of raised source/drain junctions 610 is shown in FIGS. 10A and 10B. The source/drain junctions are self-aligned over the unprotected source/drain regions of the fins, i.e., portions of the fins not protected by sacrificial gate spacer layer 530 or the sacrificial gate layer 400. As will be appreciated, epitaxial growth from top surfaces of the sacrificial gate structures 402A, 402B is precluded by hard mask 450.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. For example, an epitaxial semiconductor material deposited on a (100) crystal surface will take on a (100) orientation. Source/drain junctions 610 may comprise silicon, silicon germanium, or another suitable semiconductor material.

The selective epitaxy process deposits an epitaxial layer directly onto the exposed surfaces of the fins between sacrificial gate spacers 530. Exposed surfaces of the fins may include the top surface as well as upper portions of the sidewalls of the fins proximate to the top surface. In various embodiments, an epitaxial layer is formed without collateral deposition on exposed dielectric surfaces. Selective epitaxial layers may be formed using molecular beam epitaxy or chemical vapor deposition processes that are adapted for selective epitaxy.

An example silicon epitaxial process uses a gas mixture including $H_2$ and dichlorosilane ($SiH_2Cl_2$) at a deposition (e.g., substrate) temperature of 600-800° C. Other suitable gas sources for silicon epitaxy include silicon tetrachloride ($SiCl_4$), silane ($SiH_4$), trichlorosilane ($SiHCl_3$), and other hydrogen-reduced chlorosilanes ($SiH_xCl_{4-x}$).

Figure 11A:
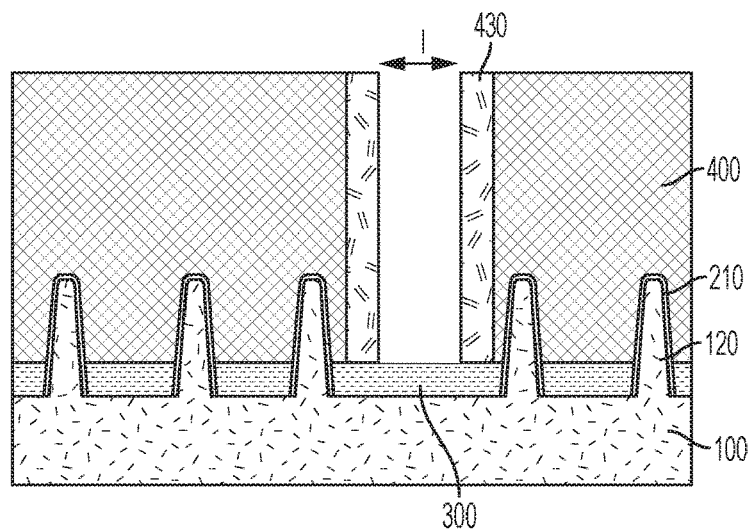
FIG. 11A depicts removal of the sacrificial gate spacer and hard mask layer following a source/drain junction module.
Figure 11B:
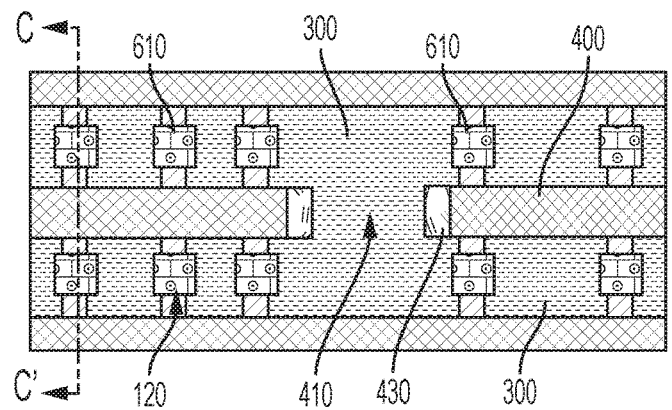
FIG. 11B depicts removal of the sacrificial gate spacer after forming source/drain junctions.
Figure 11C:
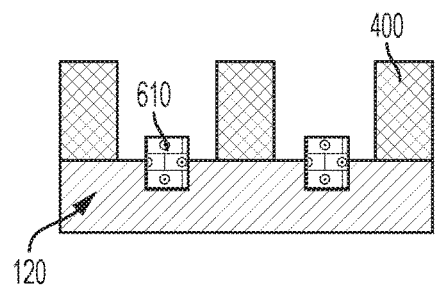
FIG. 11C is a cross-sectional view along the line C-C' of FIG. 11B.

Referring to FIGS. 11A-C, following the formation of epitaxial source/drain junctions, the fill layer 440, hard mask layer 450, and sacrificial gate spacer 530 can be removed. In various embodiments, each of the fill layer 440, hard mask layer 450, and sacrificial gate spacer 530 comprises silicon nitride, and the foregoing layers can be stripped using an etch chemistry that is selective to silicon and silicon oxide. An example wet etch chemistry suitable for selectively stripping silicon nitride may include phosphoric acid.

FIG. 11A is a cross-sectional view showing removal of the fill layer, hard mask layer and sacrificial gate spacer layer following the source/drain junction module. FIG. 11B is a corresponding top down plan view, and FIG. 11C is a further cross-sectional view of the structure along the line C-C' of FIG. 11B.

Figure 12A:
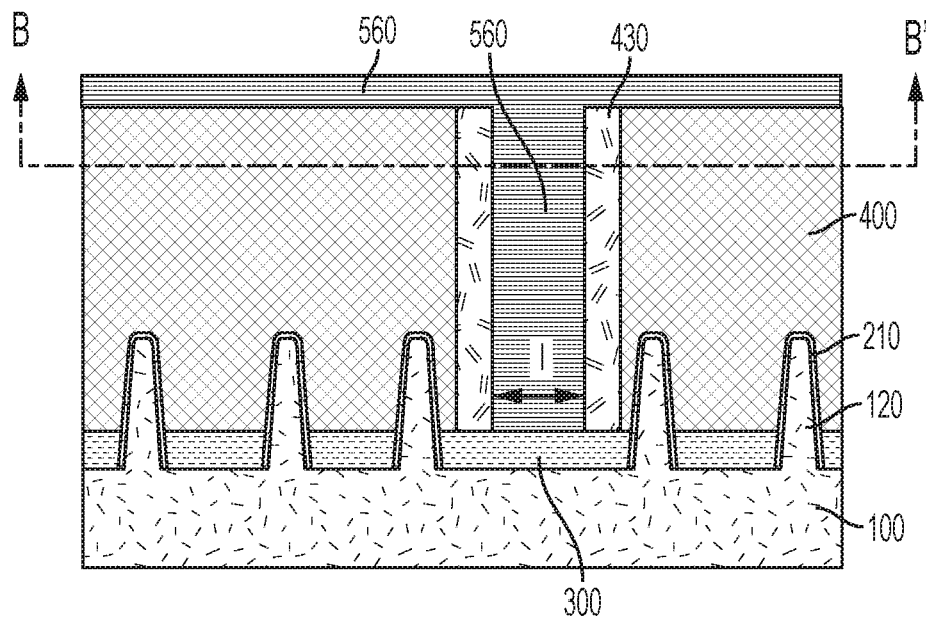
FIG. 12A shows deposition of a gate spacer over the structure of FIG. 11A.
Figure 12B:
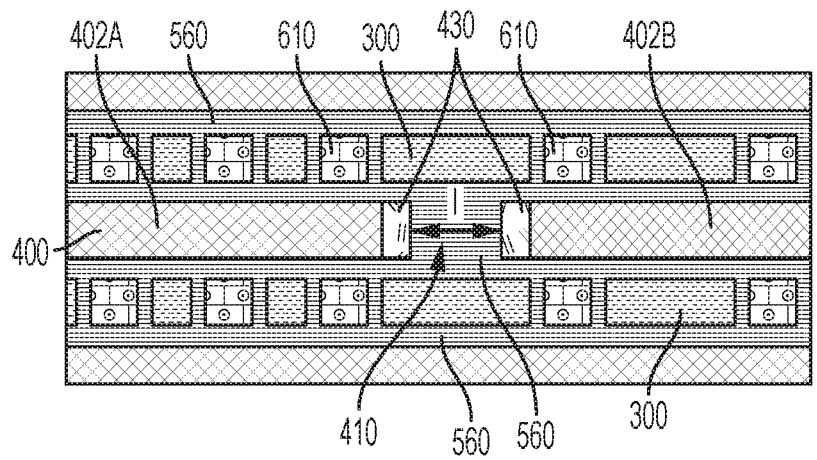
FIG. 12B shows deposition of a gate spacer over sidewalls of the sacrificial gate structures.

Referring to FIGS. 12A and 12B, a final gate spacer layer 560 is then deposited over sidewalls of the sacrificial gate structures. The final gate spacer layer 560 may comprise silicon nitride or a low-k material such as SiOCN, and may be formed using atomic layer deposition, for example, to a uniform thickness in the range of 5 to 10 nm, e.g., 5, 8 or 10 nm, including ranges between any of the foregoing values.

In certain embodiments, the final gate spacer layer 560 is formed over sidewall surfaces of the sacrificial gate layer 400, i.e., directly over spacer layer 430 within the gate cut opening 410 so as to completely fill the gate cut opening 410 between opposing end surfaces of longitudinally-adjacent sacrificial gate structures 402A and 402B.

As will be appreciated, additional processing may be used to complete the FinFET device, including the formation and planarization of an interlayer dielectric 700, followed by a replacement metal gate (RMG) module, which typically includes selective removal of the sacrificial gate structures 402A and 402B and the formation of a functional gate structure, including gate dielectric and gate conductor layers.

The disclosed methods enable the formation of sacrificial gate structures, and ultimately functional gate structures, having a small (e.g., less than 15 nm) cut dimension along a longitudinal direction, and a substantially straight (vertical) profile, which may beneficially impact device density and performance. According to various embodiments, the method includes forming the gate cut prior to further patterning and etching of the sacrificial gate layer to define the structure for the sacrificial gate.

As used herein, the singular forms "a," "an" and "the" include plural referents unless the context clearly dictates otherwise. Thus, for example, reference to a "gate cut opening" includes examples having two or more such "gate cut openings" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a hard mask that comprises amorphous silicon include embodiments where a hard mask consists essentially of amorphous silicon and embodiments where a hard mask consists of amorphous silicon.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a semiconductor structure, comprising:
   forming a sacrificial gate layer over a plurality of semiconductor fins;
   etching the sacrificial gate layer in a first etching step to form a gate cut opening that extends through the sacrificial gate layer, wherein the gate cut opening is located between an adjacent pair of the fins;
   forming a spacer layer on sidewalls of the gate cut opening; and
   etching the sacrificial gate layer in a second etching step after the first etching step to form a first sacrificial gate structure that overlies a first one of the pair of adjacent fins and a second sacrificial gate structure that overlies a second one of the pair of adjacent fins.

2. The method of claim 1, wherein the gate cut opening extends completely through the sacrificial gate layer.

3. The method of claim 1, wherein the sacrificial gate layer comprises amorphous silicon.

4. The method of claim 1, wherein the gate cut opening has at least one lateral dimension ranging from 30 to 40 nm.

5. The method of claim 1, wherein the spacer layer comprises amorphous silicon.

6. The method of claim 1, wherein the gate cut opening after forming the spacer layer has at least one lateral dimension ranging from 10 to 20 nm.

7. The method of claim 1, further comprising filling the gate cut opening prior to the second etching step.

8. The method of claim 1, wherein a distance between the first sacrificial gate structure and the second sacrificial gate structure is 10 to 20 nm.

9. The method of claim 8, wherein the distance between the first sacrificial gate structure and the second sacrificial gate structure is measured in a direction orthogonal to a length direction of the fins.

10. The method of claim 1, wherein the first etching step and the second etching step each comprise an anisotropic etch.

11. The method of claim 1, further comprising forming a dielectric layer between the first sacrificial gate structure and the second sacrificial gate structure.

12. The method of claim 1, wherein the gate cut opening has substantially vertical sidewalls.

13. A method of forming a semiconductor structure, comprising:
    forming a sacrificial gate layer over a plurality of semiconductor fins;
    etching the sacrificial gate layer in a first etching step to form a gate cut opening located between an adjacent pair of the fins;
    forming a spacer layer on sidewalls of the gate cut opening;
    depositing a fill layer within the gate cut opening to fill the gate cut opening;
    forming a patterned hard mask over the sacrificial gate layer; and
    using the patterned hard mask as an etch mask, etching the sacrificial gate layer to form a first sacrificial gate structure that overlies a first one of the pair of adjacent fins and a second sacrificial gate structure that overlies a second one of the pair of adjacent fins, wherein forming the gate cut opening precedes forming the first and second sacrificial gate structures.

14. The method of claim 13, wherein the sacrificial gate layer and the spacer layer each comprise amorphous silicon.

15. The method of claim 13, wherein the first etching step and the second etching step each comprise reactive ion etching.

16. The method of claim 13, further comprising forming a dielectric layer between the first sacrificial gate structure and the second sacrificial gate structure.

17. The method of claim 13, wherein the gate cut opening has substantially vertical sidewalls.

18. A method of forming a semiconductor structure, comprising:
    forming a sacrificial gate layer over a plurality of semiconductor fins;
    etching the sacrificial gate layer in a first etching step to form a gate cut opening that extends through the sacrificial gate layer, wherein the gate cut opening is located between an adjacent pair of the fins;
    filling the gate cut opening; and
    etching the sacrificial gate layer in a second etching step after the first etching step to form a first sacrificial gate structure that overlies a first one of the pair of adjacent fins and a second sacrificial gate structure that overlies a second one of the pair of adjacent fins, wherein the gate cut opening is filled prior to the second etching step.

\* \* \* \* \*